United States Patent
Fang et al.

(10) Patent No.: US 10,784,471 B2
(45) Date of Patent: Sep. 22, 2020

(54) ORGANIC LIGHT EMITTING DISPLAY DEVICE AND METHOD OF MAKING THE SAME

(71) Applicant: SHENZHEN CHINA STAR OPTOELECTRONICS SEMICONDUCTOR DISPLAY TECHNOLOGY CO., LTD., Guangdong (CN)

(72) Inventors: Chunhsiung Fang, Guangdong (CN); Yuanchun Wu, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 403 days.

(21) Appl. No.: 15/747,411

(22) PCT Filed: Dec. 4, 2017

(86) PCT No.: PCT/CN2017/114509
§ 371 (c)(1),
(2) Date: Jan. 24, 2018

(87) PCT Pub. No.: WO2019/095452
PCT Pub. Date: May 23, 2019

(65) Prior Publication Data
US 2020/0083489 A1    Mar. 12, 2020

(30) Foreign Application Priority Data
Nov. 17, 2017    (CN) .......................... 2017 1 1148913

(51) Int. Cl.
*H01L 27/32*    (2006.01)
*H01L 51/56*    (2006.01)
(Continued)

(52) U.S. Cl.
CPC .......... *H01L 51/56* (2013.01); *H01L 27/3246* (2013.01); *H01L 51/0016* (2013.01); *H01L 51/5228* (2013.01)

(58) Field of Classification Search
CPC .. H01L 51/56; H01L 27/3246; H01L 51/0016
(Continued)

(56) References Cited

U.S. PATENT DOCUMENTS

2007/0132368 A1*   6/2007   Kuwahara ........... H01L 51/5228
                                                                     313/503

FOREIGN PATENT DOCUMENTS

| CN | 105405862 A | 3/2016 |
| CN | 106653805 A | 5/2017 |

(Continued)

*Primary Examiner* — Elias Ullah
(74) *Attorney, Agent, or Firm* — Hemisphere Law, PLLC; Zhigang Ma

(57) ABSTRACT

An OLED display device and a manufacturing method thereof are provided. The manufacturing method of the OLED display device realizes the effect of a plurality of non-connected OLED light emitting layers by providing an inverse trapezoidal photoresist in an interval region of a plurality sub-pixels. The produced OLED display device does not have lateral current forming an entire surface distributed cathode over the plurality of OLED light emitting layers of the common layer, that avoiding cross color phenomenon caused by carrier migration between adjacent sub-pixels and ensuring better display effect of the OLED display. Also, by fabricating an auxiliary cathode above or below the cathode and connected thereto, the sheet resistance of the cathode and the uneven brightness caused by voltage drop can both be reduced.

6 Claims, 15 Drawing Sheets

(51) Int. Cl.
*H01L 51/00* (2006.01)
*H01L 51/52* (2006.01)

(58) Field of Classification Search
USPC .......................................................... 257/40
See application file for complete search history.

(56) References Cited

FOREIGN PATENT DOCUMENTS

| | | |
|---|---|---|
| CN | 107170777 | 9/2017 |
| CN | 107256882 | 10/2017 |
| JP | 2004333570 | 11/2004 |
| JP | 2012073498 | 4/2012 |
| KR | 20160058297 A | 5/2016 |

* cited by examiner

ORGANIC LIGHT EMITTING DISPLAY DEVICE AND METHOD OF MAKING THE SAME

RELATED APPLICATIONS

The present application is a National Phase of International Application Number PCT/CN2017/114509, filed on Dec. 4, 2017, and claims the priority of China Application No. 201711148913.8, filed on Nov. 17, 2017.

FIELD OF THE DISCLOSURE

The present disclosure relates to a field of a display technique. In particular, it relates to an organic light emitting display device and a method of making the same.

BACKGROUND

Organic light emitting display (OLED) device has advantages of self-luminous, low driving voltage, high luminous efficiency, short response time, sharpness, high contrast, nearly 180° viewing angle, wide usage temperature range, flexible and large-area panchromatic display and so on, is recognized as the industry's most promising display device.

According to driving methods, OLED can be classified into passive matrix OLED (PMOLED) and active matrix OLED (AMOLED), namely, direct addressing and thin film transistor matrix addressing. Among them, AMOLED has a matrix arrangement of pixels, belonging to the active display type, which has high luminous efficiency, and usually used for high-definition large-size display device.

OLED generally comprises a substrate, an anode disposed on the substrate, a hole injection layer disposed on the anode, a hole transport layer disposed on the hole injection layer, a light emitting layer disposed on the hole transport layer, an electron transport layer disposed on the light emitting layer, an electron injection layer disposed on the electron transport layer, and a cathode disposed on the electron injection layer. The light emitting principle of OLED display device is that under a driven electric field, by carrier injection and recombination, leading semiconductor materials and organic light emitting materials to light. Specifically, an OLED display device generally adopts ITO pixel electrode and a metal electrode respectively as the anode and the cathode of the device. Under a certain voltage, electrons and holes are injected from the cathode and the anode into the electron transport layer and the hole transport layer respectively. The electrons and holes migrate to the light emitting layer through the electron transport layer and the hole transport layer, respectively, and meet in the light emitting layer to form excitons and excite the light emitting molecules that emit visible light through radiation relaxation.

AMOLED display device comprises bottom-emitting OLED displays (with light emitted from the TFT substrate side) and top-emitting OLED displays (with light emitted from the encapsulating cover side). Since the light source of the top-emitting OLED display device needs to penetrate the cathode, it must be transparent cathode or translucent cathode. Transparent oxide (TCO), such as indium zinc oxide (IZO) is commonly used in the existing transparent cathode. The transparent cathode has a thickness between 100 nm to 500 nm and a sheet resistance between 5 $\Omega/\square$ to 30 $\Omega/\square$. Translucent cathode often uses of thinner metals, such as silver (Ag) and magnesium silver alloy (MgAg), in order to maintain a light transmittance greater than 40%, the thickness of the translucent cathode is generally controlled between 10 nm~20 nm, with a sheet resistance between 1 $\Omega/\square$ and 5 $\Omega/\square$. However, the transparent cathode and the translucent cathode having the above resistance values are only suitable for use in small-sized displays. When used in a large-sized display, an IR drop may occur due to a high sheet resistance of the cathode, thereby causing the display to appear uneven brightness, and farther the cathode voltage input, the lower the brightness is. In addition, both an OLED device emitting white light from the light emitting layer (white OLED structure) and an OLED device emitting RGB light from the light emitting layer (RGB side-by-side) have common layers such as a hole injection layer (HIL), hole transport layer (HTL), electron transport layer (ETL), electron injection layer (EIL) and carrier generation layer (CGL). All of these common layers are fabricated by open mask that covering the interval regions between all the sub-pixel regions and the sub-pixels. Since carrier materials of some of these common layers have better carrier transportability, the carriers will conduct laterally in these common layers to cause lateral current leakage of the common layer. When a sub-pixel is lit, sub-pixels adjacent to it are easily influenced by the current in the sub-pixel, resulting in uncontrollable brightness, and cross-color phenomenon.

As shown in FIG. 1, which is a schematic diagram showing lateral current leakage of a common layer in the existing OLED substrate. The light emitting layer 100 of the OLED substrate is a white light emitting layer, and the OLED light emitting layers 100 of all sub-pixels of the OLED substrate (including the hole injection layer, the hole transport layer, the light emitting layer, the electron transport layer, and the electron injection layer) are communicated with each other and present as a common layer. When lateral current leakage occurs inside the OLED light emitting layer 100, the carriers are moving laterally in the light emitting layer of the OLED from one sub-pixel to an adjacent sub-pixel, and affects the light emission of the adjacent sub-pixels, so that the brightness of the adjacent sub-pixels is not able to be controlled, and cross color phenomenon is easily to be occurred when the OLED substrate cooperates with the color filter to display the screen image.

SUMMARY

One objective of the present disclosure is to provide a manufacturing method of an OLED display device in which no lateral current leakage of the common layer occurs therein and a cross color phenomenon due to carrier migration between adjacent sub-pixels is avoided, the OLED display device has a better display effect, and the voltage drop caused by uneven brightness can also be reduced.

Another objective of the present disclosure is to provide an OLED display device, which does not appear cross color phenomenon, and has a better display effect, an auxiliary cathode is further disposed above or below the cathode, and connected to the cathode, such that can reduce the voltage drop caused by uneven brightness.

To achieve the above objectives, the present disclosure provides a method for manufacturing an OLED display device comprising: a step of manufacturing an OLED substrate and a step of encapsulating the OLED substrate, wherein the step of manufacturing the OLED substrate comprises: providing a base substrate, forming a plurality of anodes on the base substrate arranged in array, forming a pixel definition layer on the base substrate and the plurality of anodes, forming a plurality of first openings corresponding to the plurality of anodes respectively on the pixel definition layer, forming a plurality of OLED light emitting layers respectively on the plurality of anodes, forming a cathode on the plurality of OLED light emitting layers and the pixel definition layer, and fabricating an auxiliary cathode connected with the cathode above or below the cathode; wherein the plurality of OLED light emitting layers are not connected; and the auxiliary cathode is arranged corresponding to an interval region of the plurality of anodes.

In a first embodiment of the present disclosure, the method for manufacturing an OLED display device comprises the following specific steps:

Step S1, providing the base substrate, forming the plurality of anodes on the base substrate arranged in array, forming the pixel definition layer on the base substrate and the plurality of anodes, forming the plurality of first openings corresponding to the plurality of anodes respectively on the pixel definition layer;

Step S2: forming an inverted trapezoidal photoresist on the pixel defining layer corresponding to an interval region of the plurality of first openings;

Step S3, preparing an OLED light emitting thin film on the inverted trapezoidal photoresist, the pixel defining layer and the plurality of anodes;

Step S4, peeling off the inverted trapezoidal photoresist to remove the OLED light emitting thin film above the inverted trapezoidal photoresist, and obtaining a plurality of non-connected OLED light emitting layers;

Step S5: forming an entire surface distributed cathode over the plurality of OLED light emitting layers and the pixel definition layer;

Step S6, fabricating the auxiliary cathode on the cathode corresponding to the interval region of the plurality of first openings to obtain an OLED substrate;

Step S7, encapsulating the OLED substrate to obtain the OLED display device.

In a second embodiment of the present disclosure, the method for manufacturing an OLED display device comprises the following specific steps:

Step S1, providing the base substrate, forming the plurality of anodes on the base substrate arranged in array, forming the pixel definition layer on the base substrate and the plurality of anodes, forming the plurality of first openings corresponding to the plurality of anodes respectively on the pixel definition layer, and forming a second opening in an interval region of the plurality of first openings;

Step S2: forming an inverted trapezoidal photoresist on the base substrate at a bottom of the second opening;

Step S3, preparing an OLED light emitting thin film on the inverted trapezoidal photoresist, the pixel defining layer and the plurality of anodes;

Step S4, peeling off the inverted trapezoidal photoresist to remove the OLED light emitting thin film above the inverted trapezoidal photoresist, and obtaining a plurality of non-connected OLED light emitting layers;

Step S5: forming an entire surface distributed cathode over the plurality of OLED light emitting layers and the base substrate;

Step S6, fabricating the auxiliary cathode on the cathode corresponding to the second opening to obtain an OLED substrate;

Step S7, encapsulating the OLED substrate to obtain the OLED display device.

In a third embodiment of the present disclosure, the method for manufacturing an OLED display device comprises the following specific steps:

Step S1, providing the base substrate, forming the plurality of anodes on the base substrate arranged in array, and the auxiliary cathode arranged in the interval region of the plurality of anodes; forming the pixel definition layer on the base substrate, the plurality of anodes, and the auxiliary cathode; forming the plurality of first openings corresponding to the plurality of anodes respectively on the pixel definition layer; and forming a second opening corresponding to the auxiliary cathode;

Step S2: forming an inverted trapezoidal photoresist on the auxiliary cathode at a bottom of the second opening;

Step S3, preparing an OLED light emitting thin film on the inverted trapezoidal photoresist, the pixel defining layer and the plurality of anodes;

Step S4, peeling off the inverted trapezoidal photoresist to remove the OLED light emitting thin film above the inverted trapezoidal photoresist, and obtaining a plurality of non-connected OLED light emitting layers;

Step S5: forming an entire surface distributed cathode over the plurality of OLED light emitting layers, the pixel definition layer and the auxiliary cathode to obtain an OLED substrate;

Step S6, encapsulating the OLED substrate to obtain the OLED display device.

The inverted trapezoidal photoresist is distributed in a grid pattern; and the auxiliary cathode is distributed in a grid pattern.

The present disclosure further provides an OLED display device comprising an OLED substrate. The OLED substrate comprises a base substrate, a plurality of anodes disposed on the base substrate and arranged in array, a pixel definition layer disposed on the base substrate and the plurality of anodes, a plurality of first openings disposed on the pixel definition layer corresponding to the plurality of anodes respectively, a plurality of OLED light emitting layers respectively disposed on the plurality of anodes, a cathode disposed on the plurality of OLED light emitting layers and the pixel definition layer, and an auxiliary cathode connected with the cathode disposed above or below the cathode; wherein the plurality of OLED light emitting layers are not connected; and the auxiliary cathode is arranged corresponding to an interval region of the plurality of anodes.

In the first embodiment of the present disclosure, the OLED substrate specifically comprises: the base substrate, the plurality of anodes disposed on the base substrate and arranged in array, the pixel definition layer disposed on the base substrate and the plurality of anodes, the plurality of first openings disposed on the pixel definition layer corresponding to the plurality of anodes respectively, the plurality of OLED light emitting layers respectively disposed on the plurality of anodes, an entire surface distributed cathode disposed over the plurality of OLED light emitting layers and the pixel definition layer, and the auxiliary cathode disposed on the cathode.

In the second embodiment of the present disclosure, the OLED substrate specifically comprises: the base substrate, the plurality of anodes disposed on the base substrate and arranged in array, the pixel definition layer disposed on the base substrate and the plurality of anodes, the plurality of first openings disposed on the pixel definition layer corresponding to the plurality of anodes respectively, a second opening formed on the pixel definition layer in an interval region of the plurality of first openings, the plurality of OLED light emitting layers respectively disposed on the plurality of anodes, an entire surface distributed cathode disposed over the plurality of OLED light emitting layers and the pixel definition layer, and the auxiliary cathode disposed on the cathode.

In the third embodiment of the present disclosure, the OLED substrate specifically comprises: the base substrate; the plurality of anodes disposed on the base substrate and arranged in array; the auxiliary cathode disposed on the base substrate and arranged in the interval region of the plurality of anodes; the pixel definition layer disposed on the base substrate, the plurality of anodes, and the auxiliary cathode; the plurality of first openings disposed on the pixel definition layer corresponding to the plurality of anodes respectively; a second opening disposed on the pixel definition layer corresponding to the auxiliary cathode; the plurality of OLED light emitting layers respectively disposed on the plurality of anodes; and an entire surface distributed cathode disposed over the plurality of OLED light emitting layers, the pixel definition layer, and the auxiliary cathode.

The auxiliary cathode is distributed in a grid pattern.

The present disclosure further provides a method for manufacturing an OLED display device, comprising: a step of manufacturing an OLED substrate and a step of encapsulating the OLED substrate. Herein, the step of manufacturing the OLED substrate comprises: providing a base substrate, forming a plurality of anodes on the base substrate arranged in array, forming a pixel definition layer on the base substrate and the plurality of anodes, forming a plurality of first openings corresponding to the plurality of anodes respectively on the pixel definition layer, forming a plurality of OLED light emitting layers on the plurality of anodes respectively, forming a cathode on the plurality of OLED light emitting layers and the pixel definition layer, and fabricating an auxiliary cathode connected with the cathode above or below the cathode; wherein the plurality of OLED light emitting layers are not connected, and the auxiliary cathode is arranged corresponding to an interval region of the plurality of anodes.

Herein the method comprises the following specific steps:

Step S1, providing the base substrate, forming the plurality of anodes on the base substrate arranged in array, forming the pixel definition layer on the base substrate and the plurality of anodes, forming the plurality of first openings corresponding to the plurality of anodes respectively on the pixel definition layer;

Step S2: forming an inverted trapezoidal photoresist on the pixel defining layer corresponding to an interval region of the plurality of first openings;

Step S3, preparing an OLED light emitting thin film on the inverted trapezoidal photoresist, the pixel defining layer and the plurality of anodes;

Step S4, peeling off the inverted trapezoidal photoresist to remove the OLED light emitting thin film above the inverted trapezoidal photoresist, and obtaining a plurality of non-connected OLED light emitting layers;

Step S5: forming an entire surface distributed cathode over the plurality of OLED light emitting layers and the pixel definition layer;

Step S6, fabricating the auxiliary cathode on the cathode corresponding to the interval region of the plurality of first openings to obtain an OLED substrate;

Step S7, encapsulating the OLED substrate to obtain the OLED display device.

Herein, the inverted trapezoidal photoresist is distributed in a grid pattern; and the auxiliary cathode is distributed in a grid pattern.

Advantageous effects of present disclosure are: the method for manufacturing an OLED display device of the present disclosure achieves a disconnecting effect of the plurality of OLED light emitting layers by providing an inverted trapezoid photoresist in an interval region of the plurality of sub-pixels. The obtained OLED display device will not occur lateral current leakage in the common layer, so as to avoid cross color phenomenon caused by carrier migration between adjacent sub-pixels, further to ensure that the OLED display device has a better display effect. Besides, by making the auxiliary cathode connected to the cathode and disposing the auxiliary cathode above or below the cathode can reduce the sheet resistance of the cathode, and reduce voltage drop caused by uneven brightness. The OLED display device of the present disclosure is manufactured by the above method without lateral current leakage of the common layer, avoids the cross color phenomenon due to the carrier migration between adjacent sub-pixels, and the OLED display device has a better display effect. The cathode has a lower sheet resistance, which can reduce the brightness unevenness caused by the voltage drop.

For further understanding of the features and technical contents of the present disclosure, references are made to the following detailed description and accompanying drawings of the embodiments. However, the drawings are for reference only and are not intended to limit the present disclosure.

BRIEF DESCRIPTION OF THE DRAWINGS

The technical solutions of the present disclosure and other beneficial effects will be apparent from the following detailed description of specific embodiments with reference to the accompanying drawings. In the drawings.

DETAILED DESCRIPTION OF PREFERRED EMBODIMENTS

To further illustrate the technical means adopted by the present disclosure and the effects thereof, the details of the present disclosure will be described in the following preferred embodiments with accompanying drawings.

Figure 1:
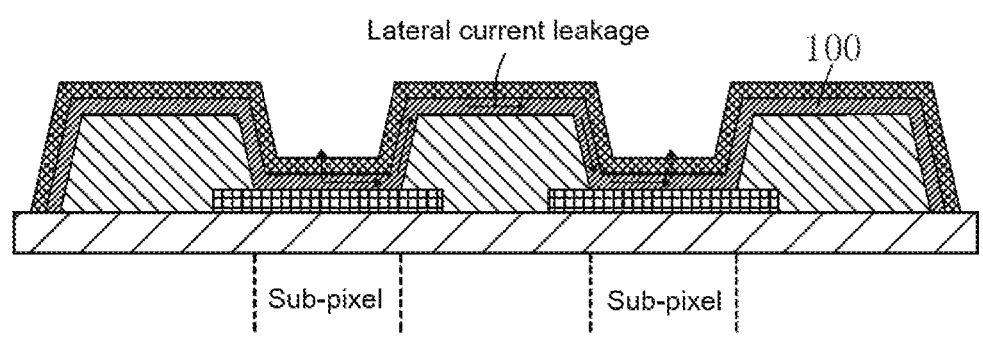
FIG. 1 is a schematic diagram of lateral current leakage of a common layer in an existing OLED display device.
Figure 2:
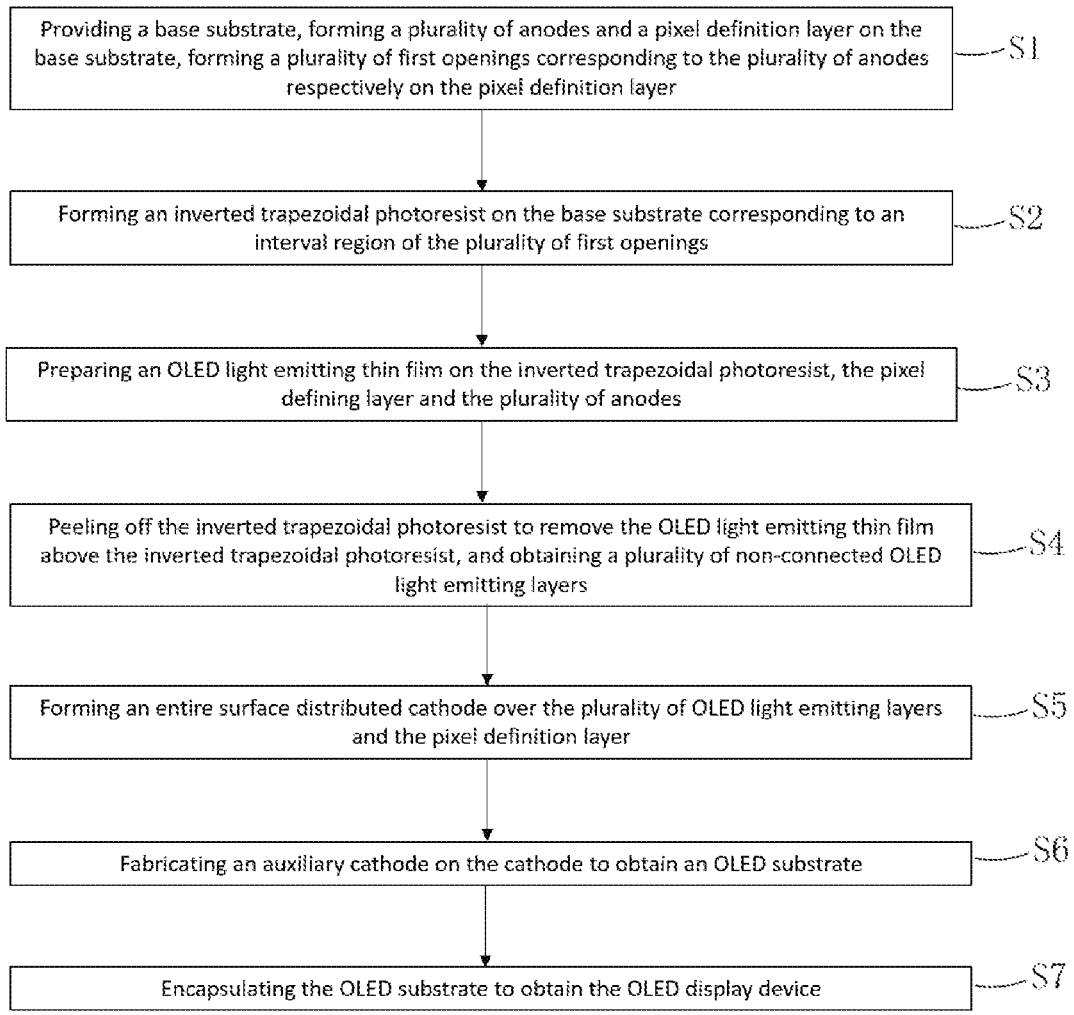
FIG. 2 is a flowchart of a method for manufacturing an OLED display device according to first embodiment of the present disclosure.
Figure 3:
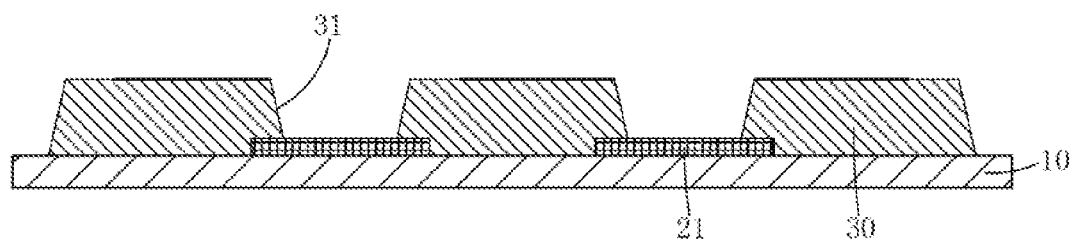
FIG. 3 is a schematic diagram of step S1 according to first embodiment of a method for manufacturing an OLED display device in the present disclosure.

Please refer to FIG. 2, the present disclosure provide a method for manufacturing an OLED display device comprising the following steps:

Step S1, as shown in FIG. 3, providing a base substrate 10, forming a plurality of anodes 21 on the base substrate 10 arranged in array, forming a pixel definition layer 30 on the base substrate 10 and the plurality of anodes 21, forming a plurality of first openings 31 corresponding to the plurality of anodes 21 respectively on the pixel definition layer 30.

Specifically, the base substrate 10 is a TFT substrate.

Specifically, the step S1 further comprises: forming a planarization layer (not shown) between the base substrate 10 and the plurality of anodes 21.

Specifically, an area of the plurality of first openings 31 is smaller than the area of the plurality of anodes 21.

Specifically, each of the plurality of anodes 21 is a reflective electrode. The OLED display device prepared by the present disclosure is a top-emitting OLED display device. Preferably, each of the plurality of anodes 21 is a composite layer formed by sandwiching a metal thin film with two transparent conductive oxide thin films. Preferably, the material of the transparent conductive oxide thin film comprises indium tin oxide (ITO), the material of the metal thin film comprises silver (Ag).

Figure 4:
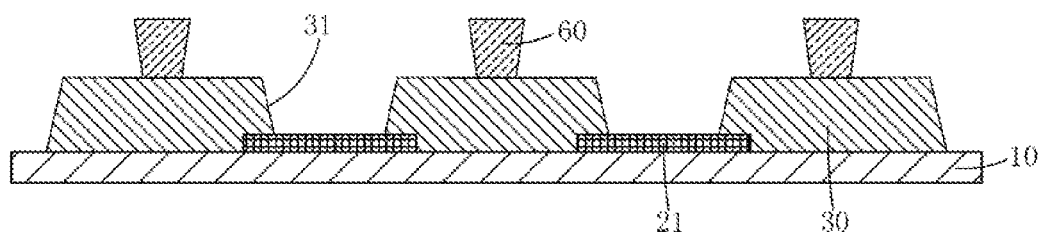
FIG. 4 is a schematic diagram of step S2 according to first embodiment of a method for manufacturing an OLED display device in the present disclosure.

Step S2, as shown in FIG. 4, forming an inverted trapezoidal photoresist 60 on the pixel defining layer 30 corresponding to an interval region of the plurality of first openings 31.

Specifically, the inverted trapezoidal photoresist 60 is distributed in a grid pattern.

Specifically, the preparation method of the inverted trapezoidal photoresist 60 comprises: photoresist coating, prebake, exposure, post expose bake (PEB), development, and post bake.

In the prior art, the photoresist patterning process generally comprises: photoresist coating, pre-bake, exposure, development, and post bake. Compared with the existing photoresist patterning process, the preparation method of the inverted trapezoidal photoresist 60 of the present disclosure adds a process of post expose bake (PEB) between the exposure and the development process to ensure that the obtained photoresist pattern has an inverted trapezoidal shape.

Figure 5:
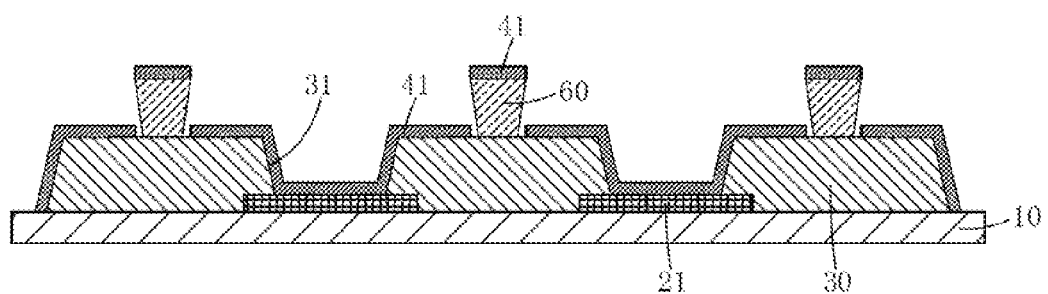
FIG. 5 is a schematic diagram of step S3 according to first embodiment of a method for manufacturing an OLED display device in the present disclosure.

Step S3, as shown in FIG. 5, preparing an OLED light emitting thin film 41 on the inverted trapezoidal photoresist 60, the pixel defining layer 30 and the plurality of anodes 21.

Specifically, the OLED light emitting thin film 41 is prepared by a vapor deposition or ink-jet print process. When the evaporation process is used, the OLED light emitting thin film 41 is fabricated by using an open mask, which is a mask having an opening in the middle, and is less expensive to fabricate. The OLED light emitting thin film 41 of the present disclosure is manufactured by using an open mask, which can greatly reduce the production cost compared with the process using a precision mask.

Figure 6:
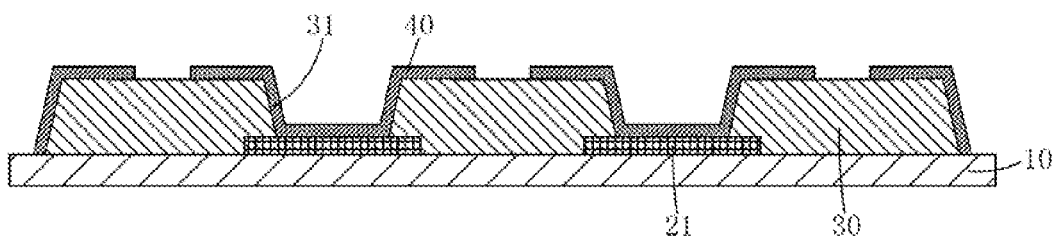
FIG. 6 is a schematic diagram of step S4 according to first embodiment of a method for manufacturing an OLED display device in the present disclosure.

Step S4, as shown in FIG. 6, peeling off the inverted trapezoidal photoresist 60 to remove the OLED light emitting thin film 41 above the inverted trapezoidal photoresist 60, and obtaining a plurality of non-connected OLED light emitting layers 40.

Specifically, the inverse trapezoidal photoresist 60 is peeled by using a photoresist stripping solvent.

Specifically, the OLED light emitting layer 40 comprises a hole injection layer, a hole transport layer, a light-emitting layer, an electron transport layer, and an electron injection layer sequentially arranged from bottom to top on the anode 21. For an OLED substrate with a white OLED structure, the light emitting layer is a white light emitting layer. For an OLED substrate with a RGB side-by-side structure, the light emitting layer is a red/green/blue light emitting layer.

Figure 7:
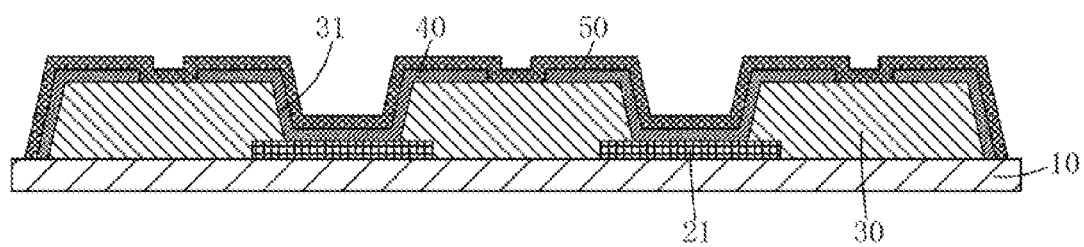
FIG. 7 is a schematic diagram of step S5 according to first embodiment of a method for manufacturing an OLED display device in the present disclosure.

Step S5, as shown in FIG. 7, forming an entire surface distributed cathode 50 over the plurality of OLED light emitting layers 40 and the pixel definition layer 30.

Specifically, the cathode 50 is a transparent electrode or a translucent electrode.

If the cathode 50 is a transparent electrode, the material of the cathode 50 is transparent oxide (TCO), and the transparent oxide is preferably indium zinc oxide (IZO). The thickness of the cathode 50 is between 100 nm~500 nm. Specifically, if the material of the cathode 50 is a transparent oxide (TCO), the cathode 50 is prepared by a sputtering method.

If the cathode 50 is a translucent electrode, the material of the cathode 50 is metal, and the metal is preferably silver (Ag) or magnesium-silver alloy (MgAg), and the thickness of the cathode 50 is between 10 nm~20 nm. The translucent electrode has a light transmittance of 40% or more. Specifically, if the material of the cathode 50 is metal, the cathode 50 is prepared by the vapor deposition method.

Figure 8:
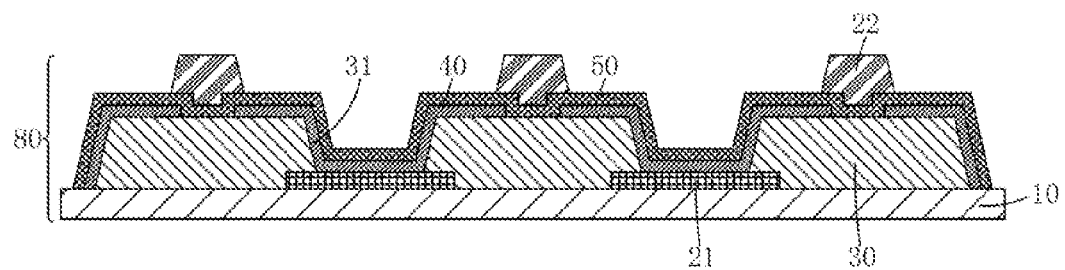
FIG. 8 is a schematic diagram of step S6 according to first embodiment of a method for manufacturing an OLED display device in the present disclosure.

Step S6, as shown in FIG. 8, fabricating the auxiliary cathode 22 on the cathode 50 corresponding to the interval region of the plurality of first openings 31 to obtain an OLED substrate 80.

By fabricating the auxiliary cathode 22 above the cathode 50 and connected thereto, it is possible to reduce the sheet resistance of the cathode 50 and reduce the problem of uneven brightness caused by voltage drop (IR drop). Since the auxiliary cathode 22 is disposed corresponding to the interval region of the plurality of first openings 31, the thickness of the cathode 50 in the sub-pixel region can be ensured not being affected, and the cathode 50 in the sub-pixel region is ensured to have high transparency and high light emitting efficiency.

Specifically, the auxiliary cathode 22 is distributed in a grid pattern.

Specifically, the thickness of the auxiliary cathode 22 is 0.5 μm~10 μm.

Specifically, the preparation method of the auxiliary cathode 22 comprises: printing conductive ink by ink-jet print or nozzle print, and drying and curing the conductive ink to form the auxiliary cathode 22. The conductive ink is a nano-silver paste, a nano-copper paste or a carbon nanotube solution. Preferably, the conductive ink is printed on the cathode 50 corresponding to the position of the original inverted trapezoidal photoresist 60, and the auxiliary cathode 22 is formed after being dried and cured.

Figure 9:
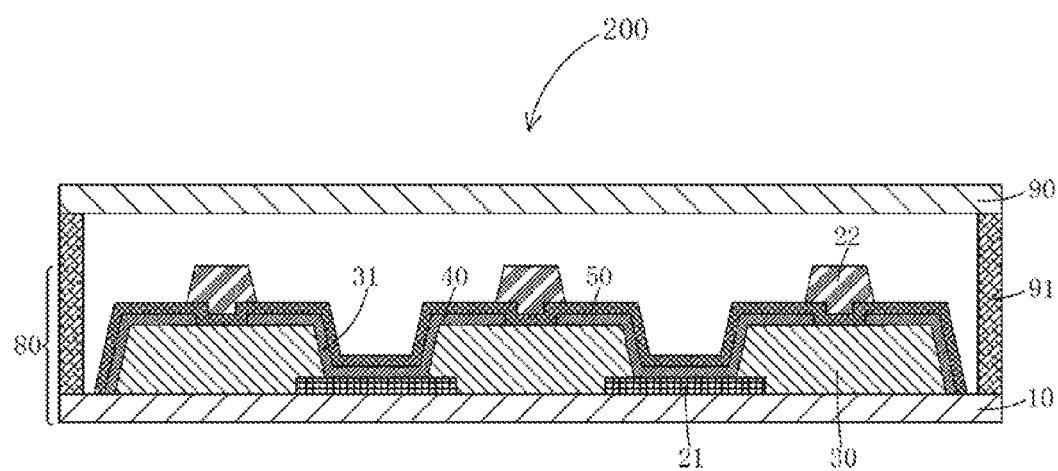
FIG. 9 is a schematic diagram of step S7 according to first embodiment of a method for manufacturing an OLED display device in the present disclosure.

Step S7, as shown in FIG. 9, encapsulating the OLED substrate 80 to obtain the OLED display device 200.

Specifically, the step S7 comprises: providing an encapsulating cover 90 and the encapsulant 91, coating the encapsulant 91 on the encapsulation the encapsulating cover 90 or the OLED substrate. The encapsulating cover 90 is then aligned with the OLED substrate 80, the OLED display device 200 is obtained after the encapsulant 91 is cured.

Specifically, the encapsulating cover 90 is a glass substrate or a glass substrate with a color filter. The glass substrate is used with the OLED substrate 80 having an RGB side-by-side structure. The glass substrate having a color filter is used with the OLED substrate 80 having a white OLED structure.

In the foregoing method for manufacturing the OLED display device, the inverted trapezoidal photoresist 60 corresponding to the interval region of the plurality of first openings 31 is first formed, and then the OLED light emitting thin film 41 is fabricated. Then, the inverted trapezoidal photoresist 60 and the OLED light-emitting film 41 disposed thereon are removed to obtain a plurality of non-connected OLED light emitting layers 40. The OLED light emitting layers has no lateral current leakage of the common layer, a cross color phenomenon due to carrier migration between adjacent sub-pixels is avoided. And the auxiliary cathode 22 connected to the cathode 50 is disposed above the cathode 50 to reduce the sheet resistance of the cathode 50 and reduce the problem of uneven brightness caused by the voltage drop (IR drop).

Please refer to FIG. 9, based on the foregoing method for manufacturing the OLED display device, the present disclosure further provides an OLED display device 200, comprising an OLED substrate 80. The OLED substrate 80 comprises: a base substrate 10, a plurality of anodes 21 disposed on the base substrate 10 and arranged in array, a pixel definition layer 30 disposed on the base substrate 10 and the plurality of anodes 21, a plurality of first openings 31 disposed on the pixel definition layer 30 corresponding to the plurality of anodes 21 respectively, a plurality of OLED light emitting layers 40 respectively disposed on the plurality of anodes 21, an entire surface distributed cathode 50 disposed on the plurality of OLED light emitting layers 40 and the pixel definition layer 30, and an auxiliary cathode 22 disposed on the cathode 50 corresponding to an interval region of the plurality first openings 31; wherein the plurality of OLED light emitting layers 40 are not connected.

Specifically, the OLED display device 200 further comprises: an encapsulating cover 90, and an encapsulant 91 disposed between the OLED substrate 80 and the encapsulating cover 90 for sealing and connecting the OLED substrate 80 and the encapsulating cover 90.

Specifically, the encapsulating cover 90 is a glass substrate or a glass substrate with a color filter. The glass substrate is used with the OLED substrate 80 having an RGB side-by-side structure. The glass substrate having a color filter is used with the OLED substrate 80 having a white OLED structure. Specifically, the base substrate 10 is a TFT substrate.

Specifically, the OLED substrate 80 further comprises a planarization layer (not shown) disposed between the base substrate 10 and the plurality of anodes 21.

Specifically, an area of the plurality of first openings 31 is smaller than the area of the plurality of anodes 21.

Specifically, each of the plurality of anodes 21 is a reflective electrode. The OLED display device of the present disclosure is a top-emitting OLED display device. Preferably, each of the plurality of anodes 21 is a composite layer formed by sandwiching a metal thin film with two transparent conductive oxide thin films. Preferably, the material of the transparent conductive oxide thin film comprises indium tin oxide (ITO), the material of the metal thin film comprises silver (Ag).

Specifically, the OLED light emitting layer 40 comprises a hole injection layer, a hole transport layer, a light-emitting layer, an electron transport layer, and an electron injection layer sequentially arranged from bottom to top on the anode 21. For an OLED substrate with a white OLED structure, the light emitting layer is a white light emitting layer. For an OLED substrate with a RGB side-by-side structure, the light emitting layer is a red/green/blue light emitting layer.

Specifically, the cathode 50 is a transparent electrode or a translucent electrode.

If the cathode 50 is a transparent electrode, the material of the cathode 50 is transparent oxide (TCO), and the transparent oxide is preferably indium zinc oxide (IZO). The thickness of the cathode 50 is between 100 nm~500 nm.

If the cathode 50 is a translucent electrode, the material of the cathode 50 is metal, and the metal is preferably silver (Ag) or magnesium-silver alloy (MgAg), and the thickness of the cathode 50 is between 10 nm~20 nm. The translucent electrode has a light transmittance of 40% or more.

Specifically, the auxiliary cathode 22 is distributed in a grid pattern.

Specifically, the auxiliary cathode 22 has a thickness of 0.5 μm~10 μm.

Specifically, the material of the auxiliary cathode 22 is a nano-silver, a nano-copper or a carbon nanotube.

The foregoing OLED display device comprises a plurality of OLED light emitting layers 40 respectively disposed on the plurality of anodes 21, wherein a plurality of the OLED light emitting layers 40 are not connected to each other so that lateral current leakage of the common layer does not occur, a cross color phenomenon due to carrier migration between adjacent sub-pixels is avoided, with can ensure a better display effect. And the auxiliary cathode 22 connected to the cathode 50 is disposed above the cathode 50 to reduce the sheet resistance of the cathode 50 and reduce the problem of uneven brightness caused by the voltage drop (IR drop).

Figure 10:
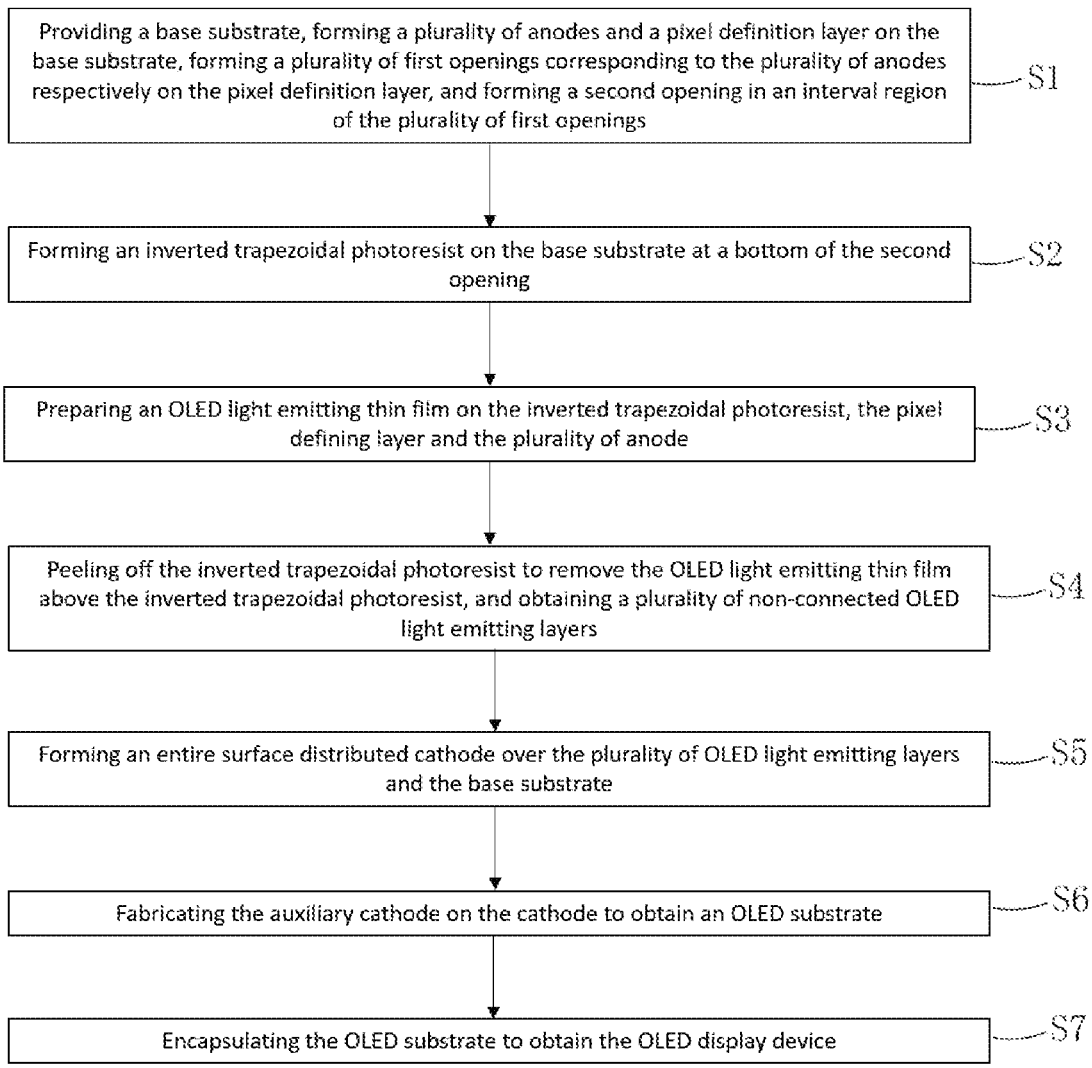
FIG. 10 is a flowchart of a method for manufacturing an OLED display device according to second embodiment of the present disclosure.
Figure 11:
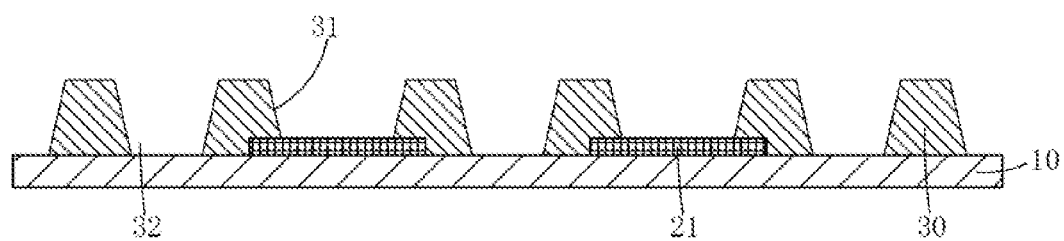
FIG. 11 is a schematic diagram of step S1 according to second embodiment of a method for manufacturing an OLED display device in the present disclosure.

Please refer to FIG. 10, the present disclosure provides a method for manufacturing an OLED display device, comprising the following steps:

Step S1, as shown in FIG. 11, providing a base substrate 10, forming a plurality of anodes 21 on the base substrate 10 and arranged in array, forming a pixel definition layer 30 on the base substrate 10 and the plurality of anodes 21, forming a plurality of first openings 31 corresponding to the plurality of anodes 21 respectively on the pixel definition layer 30, and forming a second opening 32 in an interval region of the plurality of first openings 31.

Specifically, the second opening 32 is distributed in a grid pattern.

Specifically, the base substrate 10 is a TFT substrate.

Specifically, the step S1 further comprises: forming a planarization layer (not shown) between the base substrate 10 and the plurality of anodes 21.

Specifically, an area of the plurality of first openings 31 is smaller than the area of the plurality of anodes 21.

Specifically, each of the plurality of anodes 21 is a reflective electrode. The OLED display device prepared by the present disclosure is a top-emitting OLED display device. Preferably, each of the plurality of anodes 21 is a composite layer formed by sandwiching a metal thin film with two transparent conductive oxide thin films. Preferably, the material of the transparent conductive oxide thin film comprises indium tin oxide (ITO), the material of the metal thin film comprises silver (Ag).

Figure 12:
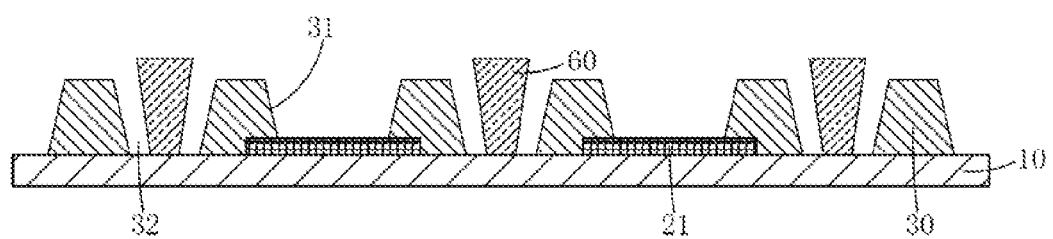
FIG. 12 is a schematic diagram of step S2 according to second embodiment of a method for manufacturing an OLED display device in the present disclosure.

Step S2: as shown in FIG. 12, forming an inverted trapezoidal photoresist 60 on the base substrate 10 at a bottom of the second opening 32.

Specifically, the inverted trapezoidal photoresist 60 is distributed in a grid pattern.

Specifically, the preparation method of the inverted trapezoidal photoresist 60 comprises: photoresist coating, pre-bake, exposure, post expose bake (PEB), development, and post bake.

In the prior art, the photoresist patterning process generally comprises: photoresist coating, pre-bake, exposure, development, and post bake. Compared with the existing photoresist patterning process, the preparation method of the inverted trapezoidal photoresist 60 of the present disclosure adds a process of post expose bake (PEB) between the exposure and the development process to ensure that the obtained photoresist pattern has an inverted trapezoidal shape.

Figure 13:
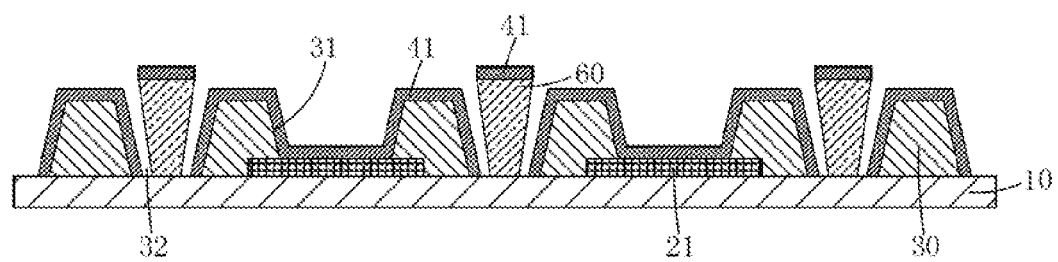
FIG. 13 is a schematic diagram of step S3 according to second embodiment of a method for manufacturing an OLED display device in the present disclosure.

Step S3, as shown in FIG. 13, preparing an OLED light emitting thin film 41 on the inverted trapezoidal photoresist 60, the pixel defining layer 30 and the plurality of anodes 21.

Specifically, the OLED light emitting thin film 41 is prepared by a vapor deposition or ink-jet print process. When the evaporation process is used, the OLED light emitting thin film 41 is fabricated by using an open mask, which is a mask having an opening in the middle, and is less expensive to fabricate. The OLED light emitting thin film 41 of the present disclosure is manufactured by using an open mask, which can greatly reduce the production cost compared with the process using a precision mask.

Figure 14:
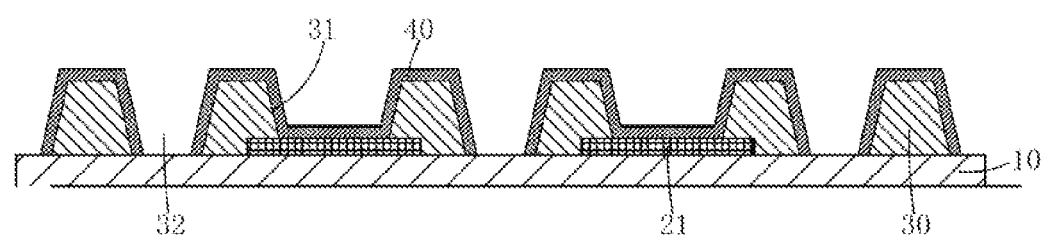
FIG. 14 is a schematic diagram of step S4 according to second embodiment of a method for manufacturing an OLED display device in the present disclosure.

Step S4, as shown in FIG. 14, peeling off the inverted trapezoidal photoresist 60 to remove the OLED light emitting thin film 41 above the inverted trapezoidal photoresist 60, and obtaining a plurality of non-connected OLED light emitting layers 40.

Specifically, the inverse trapezoidal photoresist 60 is peeled by using a photoresist stripping solvent.

Specifically, the OLED light emitting layer 40 comprises a hole injection layer, a hole transport layer, a light-emitting layer, an electron transport layer, and an electron injection layer sequentially arranged from bottom to top on the anode 21. For an OLED substrate with a white OLED structure, the light emitting layer is a white light emitting layer. For an OLED substrate with a RGB side-by-side structure, the light emitting layer is a red/green/blue light emitting layer.

Figure 15:
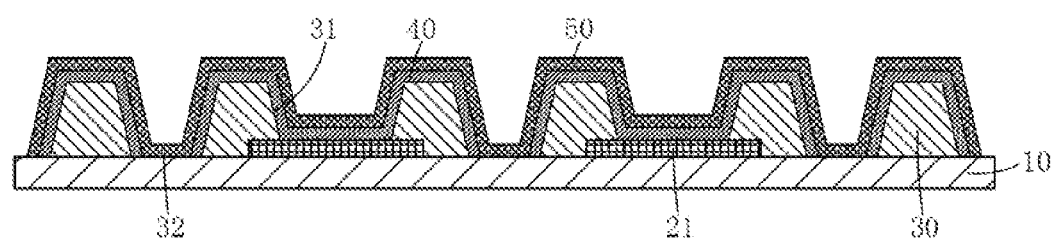
FIG. 15 is a schematic diagram of step S5 according to second embodiment of a method for manufacturing an OLED display device in the present disclosure.

Step S5, as shown in FIG. 15, forming an entire surface distributed cathode 50 over the plurality of OLED light emitting layers 40 and the base substrate 10.

Specifically, the cathode 50 is a transparent electrode or a translucent electrode.

If the cathode 50 is a transparent electrode, the material of the cathode 50 is transparent oxide (TCO), and the transparent oxide is preferably indium zinc oxide (IZO). The thickness of the cathode 50 is between 100 nm~500 nm. Specifically, if the material of the cathode 50 is a transparent oxide (TCO), the cathode 50 is prepared by a sputtering method.

If the cathode 50 is a translucent electrode, the material of the cathode 50 is metal, and the metal is preferably silver (Ag) or magnesium-silver alloy (MgAg), and the thickness of the cathode 50 is between 10 nm~20 nm. The translucent electrode has a light transmittance of 40% or more. Specifically, if the material of the cathode 50 is metal, the cathode 50 is prepared by the vapor deposition method.

Figure 16:
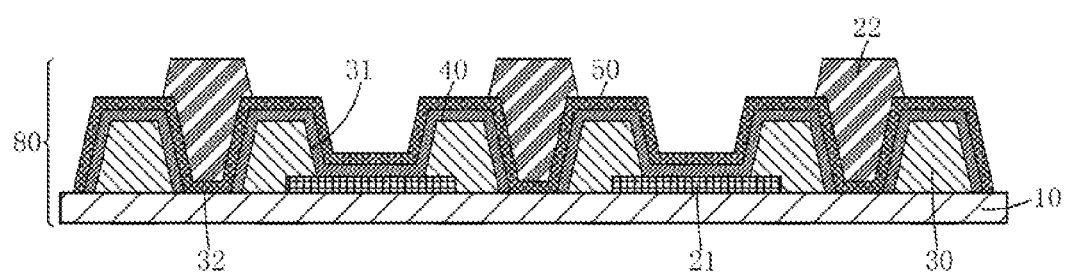
FIG. 16 is a schematic diagram of step S6 according to second embodiment of a method for manufacturing an OLED display device in the present disclosure.

Step S6, as shown in FIG. 16, fabricating the auxiliary cathode 22 on the cathode 50 corresponding to the interval region of the plurality of second openings 32 to obtain an OLED substrate 80.

By fabricating the auxiliary cathode 22 above the cathode 50 and connected thereto, it is possible to reduce the sheet resistance of the cathode 50 and reduce the problem of uneven brightness caused by voltage drop (IR drop). Since the auxiliary cathode 22 is disposed corresponding to the second opening 32, the thickness of the cathode 50 in the sub-pixel region can be ensured not being affected, and the cathode 50 in the sub-pixel region is ensured to have higher transparency and higher light emitting efficiency.

Specifically, the auxiliary cathode 22 is distributed in a grid pattern.

Specifically, the thickness of the auxiliary cathode 22 is 0.5 μm~10 μm.

Specifically, the preparation method of the auxiliary cathode 22 comprises: printing conductive ink by ink-jet print or nozzle print, and drying and curing the conductive ink to form the auxiliary cathode 22. The conductive ink is a nano-silver paste, a nano-copper paste or a carbon nanotube solution. Preferably, the conductive ink is printed on the cathode 50 corresponding to the position of the original inverted trapezoidal photoresist 60, and the auxiliary cathode 22 is formed after being dried and cured.

Figure 17:
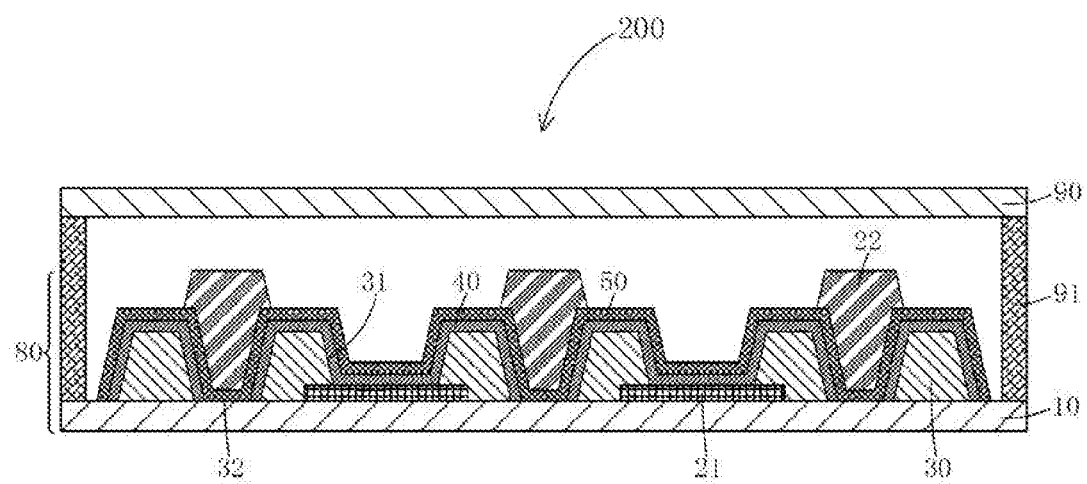
FIG. 17 is a schematic diagram of step S7 according to second embodiment of a method for manufacturing an OLED display device in the present disclosure.

Step S7, as shown in FIG. 17, encapsulating the OLED substrate 80 to obtain the OLED display device 200.

Specifically, the step S7 comprises: providing an encapsulating cover 90 and the encapsulant 91, coating the encapsulant 91 on the encapsulation the encapsulating cover 90 or the OLED substrate. The encapsulating cover 90 is then aligned with the OLED substrate 80, the OLED display device 200 is obtained after the encapsulant 91 is cured.

Specifically, the encapsulating cover 90 is a glass substrate or a glass substrate with a color filter. The glass substrate is used with the OLED substrate 80 having an RGB side-by-side structure. The glass substrate having a color filter is used with the OLED substrate 80 having a white OLED structure.

In the foregoing method for manufacturing the OLED display device, the inverted trapezoidal photoresist 60 corresponding to the interval region of the plurality of first openings 31 is first formed, and then the OLED light emitting thin film 41 is fabricated. Then, the inverted trapezoidal photoresist 60 and the OLED light-emitting film 41 disposed thereon are removed to obtain a plurality of non-connected OLED light emitting layers 40. The OLED light emitting layers has no lateral current leakage of the common layer, a cross color phenomenon due to carrier migration between adjacent sub-pixels is avoided. And the auxiliary cathode 22 connected to the cathode 50 is disposed above the cathode 50 to reduce the sheet resistance of the cathode 50 and reduce the problem of uneven brightness caused by the voltage drop (IR drop).

Please refer to FIG. 17, based on the foregoing method for manufacturing the OLED display device, the present disclosure further provides an OLED display device 200, comprising an OLED substrate 80. The OLED substrate 80 comprises: a base substrate 10, a plurality of anodes 21 disposed on the base substrate 10 and arranged in array, a pixel definition layer 30 disposed on the base substrate 10 and the plurality of anodes 21, a plurality of first openings 31 disposed on the pixel definition layer 30 corresponding to the plurality of anodes 21 respectively, a second opening 32 disposed on the pixel definition layer 30 in an interval region of the plurality of first openings 31, a plurality of OLED light emitting layers 40 respectively disposed on the plurality of anodes 21, an entire surface distributed cathode 50 disposed on the plurality of OLED light emitting layers 40 and the pixel definition layer 30, and an auxiliary cathode 22 disposed on the cathode 50 corresponding to an interval region of the second opening 32; wherein the plurality of OLED light emitting layers 40 are not connected.

Specifically, the OLED display device 200 further comprises: an encapsulating cover 90, and an encapsulant 91 disposed between the OLED substrate 80 and the encapsulating cover 90 for sealing and connecting the OLED substrate 80 and the encapsulating cover 90.

Specifically, the encapsulating cover 90 is a glass substrate or a glass substrate with a color filter. The glass substrate is used with the OLED substrate 80 having an RGB side-by-side structure. The glass substrate having a color filter is used with the OLED substrate 80 having a white OLED structure.

Specifically, the second opening 32 is distributed in a grid pattern.

Specifically, the base substrate 10 is a TFT substrate.

Specifically, the OLED substrate 80 further comprises a planarization layer (not shown) disposed between the base substrate 10 and the plurality of anodes 21.

Specifically, an area of the plurality of first openings 31 is smaller than the area of the plurality of anodes 21.

Specifically, each of the plurality of anodes 21 is a reflective electrode. The OLED display device of the present disclosure is a top-emitting OLED display device. Preferably, each of the plurality of anodes 21 is a composite layer formed by sandwiching a metal thin film with two transparent conductive oxide thin films. Preferably, the material of the transparent conductive oxide thin film comprises indium tin oxide (ITO), the material of the metal thin film comprises silver (Ag).

Specifically, the OLED light emitting layer 40 comprises a hole injection layer, a hole transport layer, a light-emitting layer, an electron transport layer, and an electron injection layer sequentially arranged from bottom to top on the anode 21. For an OLED substrate with a white OLED structure, the light emitting layer is a white light emitting layer. For an OLED substrate with a RGB side-by-side structure, the light emitting layer is a red/green/blue light emitting layer.

Specifically, the cathode 50 is a transparent electrode or a translucent electrode.

If the cathode 50 is a transparent electrode, the material of the cathode 50 is transparent oxide (TCO), and the transparent oxide is preferably indium zinc oxide (IZO). The thickness of the cathode 50 is between 100 nm~500 nm.

If the cathode 50 is a translucent electrode, the material of the cathode 50 is metal, and the metal is preferably silver (Ag) or magnesium-silver alloy (MgAg), and the thickness of the cathode 50 is between 10 nm~20 nm. The translucent electrode has a light transmittance of 40% or more.

Specifically, the auxiliary cathode 22 is distributed in a grid pattern.

Specifically, the auxiliary cathode 22 has a thickness of 0.5 μm~10 μm.

Specifically, the material of the auxiliary cathode 22 is a nano-silver, a nano-copper or a carbon nanotube.

The foregoing OLED display device comprises a plurality of OLED light emitting layers 40 respectively disposed on the plurality of anodes 21, wherein a plurality of the OLED light emitting layers 40 are not connected to each other so that lateral current leakage of the common layer does not occur, a cross color phenomenon due to carrier migration between adjacent sub-pixels is avoided, with can ensure a better display effect. And the auxiliary cathode 22 connected to the cathode 50 is disposed above the cathode 50 to reduce the sheet resistance of the cathode 50 and reduce the problem of uneven brightness caused by the voltage drop (IR drop).

Figure 18:
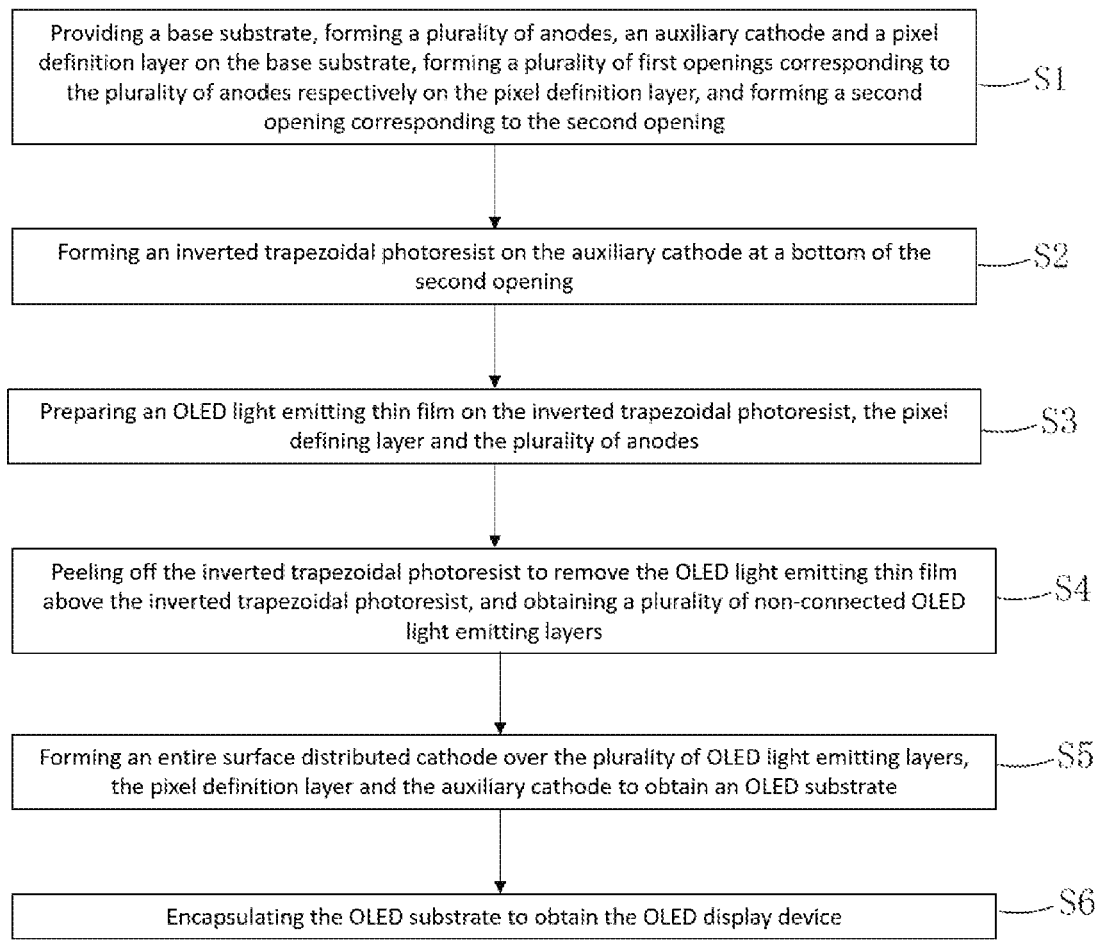
FIG. 18 is a flowchart of a method for manufacturing an OLED display device according to third embodiment of the present disclosure.
Figure 19:
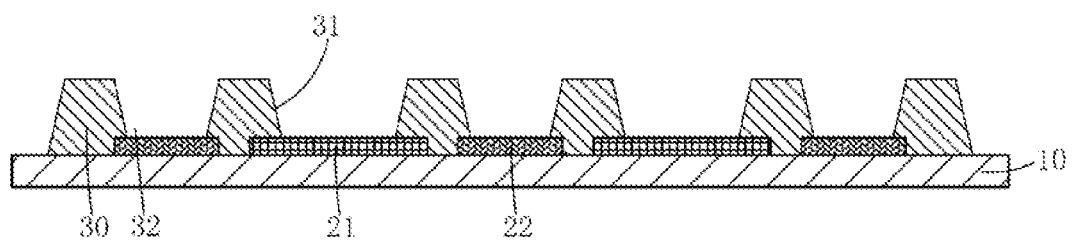
FIG. 19 is a schematic diagram of step S1 according to third embodiment of a method for manufacturing an OLED display device in the present disclosure.

Please refer to FIG. 18, the present disclosure further provides a method for manufacturing an OLED display device, comprising the following steps:

Step S1, as shown in FIG. 19, providing a base substrate 10, forming a plurality of anodes 21 on the base substrate 10 and arranged in array, forming an auxiliary cathode 22 in an interval region of the plurality of anodes 21, forming a pixel definition layer 30 on the base substrate 10 and the plurality of anodes 21, forming a plurality of first openings 31 corresponding to the plurality of anodes 21 respectively on the pixel definition layer 30, and forming a second opening 32 in an interval region of the plurality of first openings 31.

Specifically, each of the plurality of anodes 21 is a reflective electrode. The OLED display device prepared by the present disclosure is a top-emitting OLED display device. Preferably, each of the plurality of anodes 21 is a composite layer formed by sandwiching a metal thin film with two transparent conductive oxide thin films. Preferably, the material of the transparent conductive oxide thin film comprises indium tin oxide (ITO), the material of the metal thin film comprises silver (Ag).

Specifically, the second opening 32 is distributed in a grid pattern.

Specifically, the auxiliary cathode 22 is fabricated by using photolithography process.

Specifically, the material of the auxiliary cathode 22 comprises one or more of metals such as silver (Ag), copper (Cu), aluminum (Al), and molybdenum (Mo).

Specifically, the auxiliary cathode 22 has a thickness of 0.5 μm~10 μm.

Specifically, the second opening 32 is distributed in a grid pattern.

Specifically, the base substrate 10 is a TFT substrate.

Specifically, the step S1 further comprises: forming a planarization layer (not shown) between the base substrate 10 and the plurality of anodes 21.

Specifically, an area of the plurality of first openings 31 is smaller than the area of the plurality of anodes 21.

Figure 20:
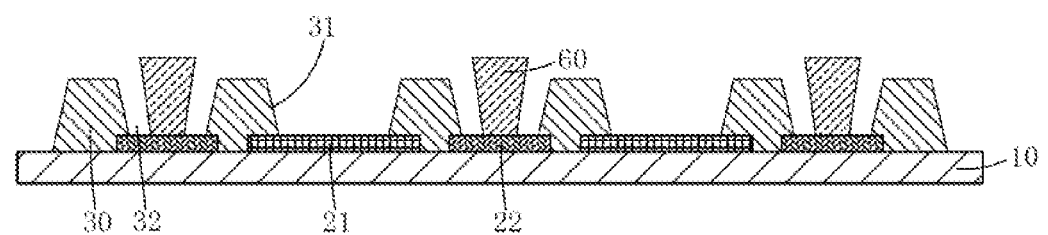
FIG. 20 is a schematic diagram of step S2 according to third embodiment of a method for manufacturing an OLED display device in the present disclosure.

Step S2: as shown in FIG. 20, forming an inverted trapezoidal photoresist 60 on the auxiliary cathode 22 at a bottom of the second opening 32.

Specifically, the inverted trapezoidal photoresist 60 is distributed in a grid pattern.

Specifically, the preparation method of the inverted trapezoidal photoresist 60 comprises: photoresist coating, pre-bake, exposure, post expose bake (PEB), development, and post bake.

In the prior art, the photoresist patterning process generally comprises: photoresist coating, pre-bake, exposure, development, and post bake. Compared with the existing photoresist patterning process, the preparation method of the inverted trapezoidal photoresist 60 of the present disclosure adds a process of post expose bake (PEB) between the exposure and the development process to ensure that the obtained photoresist pattern has an inverted trapezoidal shape.

Figure 21:
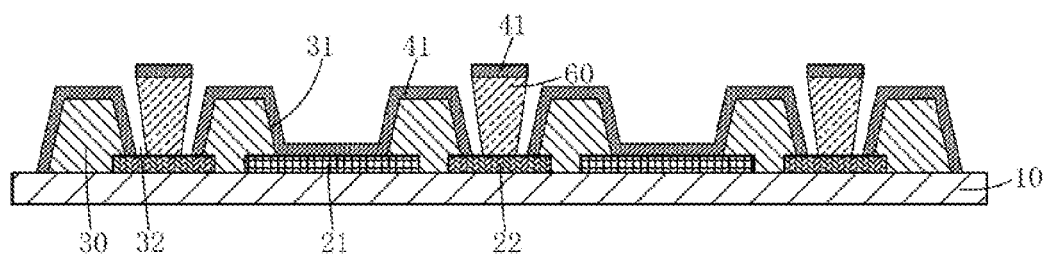
FIG. 21 is a schematic diagram of step S3 according to third embodiment of a method for manufacturing an OLED display device in the present disclosure.

Step S3, as shown in FIG. 21, preparing an OLED light emitting thin film 41 on the inverted trapezoidal photoresist 60, the pixel defining layer 30 and the plurality of anodes 21.

Specifically, the OLED light emitting thin film 41 is prepared by a vapor deposition or ink-jet print process. When the evaporation process is used, the OLED light emitting thin film 41 is fabricated by using an open mask, which is a mask having an opening in the middle, and is less expensive to fabricate. The OLED light emitting thin film 41 of the present disclosure is manufactured by using an open mask, which can greatly reduce the production cost compared with the process using a precision mask.

Figure 22:
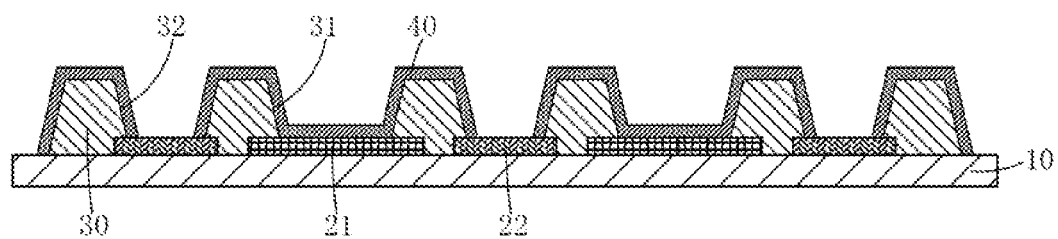
FIG. 22 is a schematic diagram of step S4 according to third embodiment of a method for manufacturing an OLED display device in the present disclosure.

Step S4, as shown in FIG. 22, peeling off the inverted trapezoidal photoresist 60 to remove the OLED light emitting thin film 41 above the inverted trapezoidal photoresist 60, and obtaining a plurality of non-connected OLED light emitting layers 40.

Specifically, the inverse trapezoidal photoresist 60 is peeled by using a photoresist stripping solvent.

Specifically, the OLED light emitting layer 40 comprises a hole injection layer, a hole transport layer, a light-emitting layer, an electron transport layer, and an electron injection layer sequentially arranged from bottom to top on the anode 21. For an OLED substrate with a white OLED structure, the light emitting layer is a white light emitting layer. For an OLED substrate with a RGB side-by-side structure, the light emitting layer is a red/green/blue light emitting layer.

Figure 23:
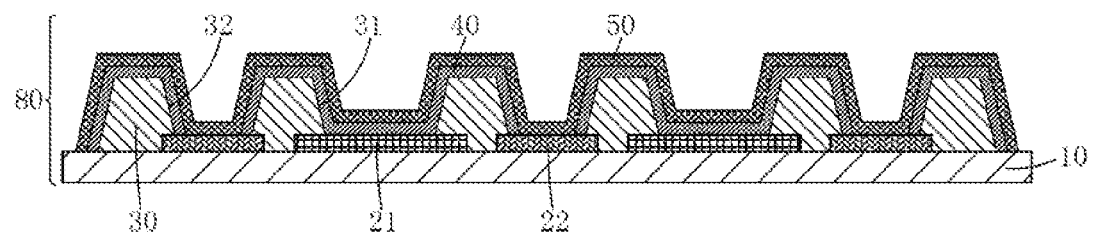
FIG. 23 is a schematic diagram of step S5 according to third embodiment of a method for manufacturing an OLED display device in the present disclosure.

Step S5, as shown in FIG. 23, forming an entire surface distributed cathode 50 over the plurality of OLED light emitting layers 40, the pixel definition layer 30 and the auxiliary cathode 22 to obtain the OLED substrate 80.

Specifically, the cathode 50 is a transparent electrode or a translucent electrode.

If the cathode 50 is a transparent electrode, the material of the cathode 50 is transparent oxide (TCO), and the transparent oxide is preferably indium zinc oxide (IZO). The thickness of the cathode 50 is between 100 nm~500 nm. Specifically, if the material of the cathode 50 is a transparent oxide (TCO), the cathode 50 is prepared by a sputtering method, If the cathode 50 is a translucent electrode, the material of the cathode 50 is metal, and the metal is preferably silver (Ag) or magnesium-silver alloy (MgAg), and the thickness of the cathode 50 is between 10 nm~20 nm. The translucent electrode has a light transmittance of 40% or more. Specifically, if the material of the cathode 50 is metal, the cathode 50 is prepared by the vapor deposition method.

By fabricating the auxiliary cathode 22 under the cathode 50, the sheet resistance of the cathode 50 can be reduced and the problem of uneven brightness caused by a voltage drop (IR drop) can be reduced. Since the auxiliary cathode 22 is disposed corresponding to the second opening 32, the thickness of the cathode 50 in the pixel region is not affected, and the cathode 50 located in the sub-pixel region is ensured to have a high transparency and a high light-emitting rate.

Figure 24:
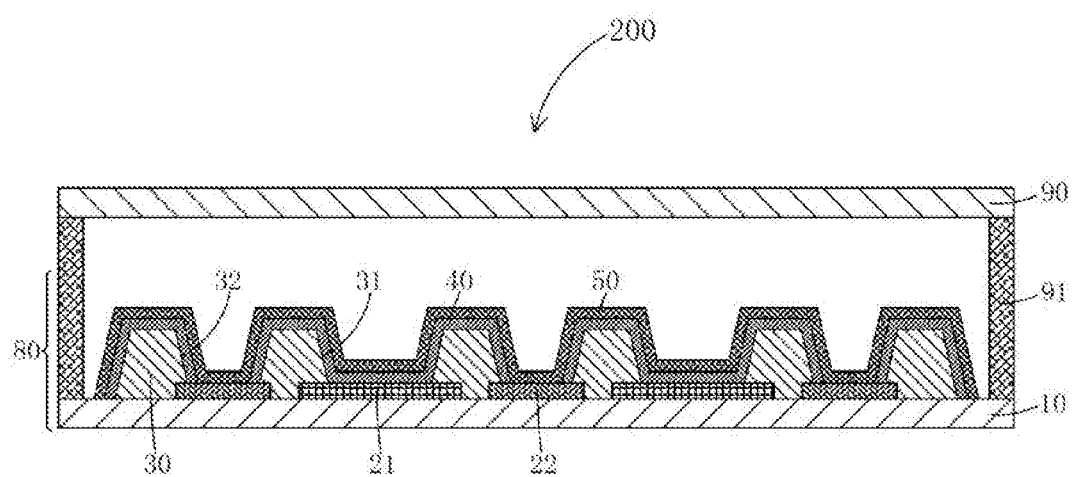
FIG. 24 is a schematic diagram of step S6 according to third embodiment of a method for manufacturing an OLED display device in the present disclosure.

Step S6, as shown in FIG. 24, encapsulating the OLED substrate 80 to obtain the OLED display device 200.

Specifically, the step S6 comprises: providing an encapsulating cover 90 and the encapsulant 91, coating the encapsulant 91 on the encapsulation the encapsulating cover 90 or the OLED substrate. The encapsulating cover 90 is then aligned with the OLED substrate 80, the OLED display device 200 is obtained after the encapsulant 91 is cured.

Specifically, the encapsulating cover 90 is a glass substrate or a glass substrate with a color filter. The glass substrate is used with the OLED substrate 80 having an RGB side-by-side structure. The glass substrate having a color filter is used with the OLED substrate 80 having a white OLED structure.

In the foregoing method for manufacturing the OLED display device, the second opening 32 corresponding to the interval region of the plurality of first openings 31 is first formed, and the inverted trapezoidal photoresist 60 is formed in the second opening 32, and then the OLED light emitting thin film 41 is fabricated. After that, the inverted trapezoidal photoresist 60 and the OLED light-emitting film 41 disposed thereon are removed to obtain a plurality of non-connected OLED light emitting layers 40. The OLED light emitting layers 40 has no lateral current leakage of the common layer, a cross color phenomenon caused by carrier migration between adjacent sub-pixels is avoided, which is capable to ensure a better display effect of the OLED display device. And the auxiliary cathode 22 is connected under the cathode 50 to reduce the sheet resistance of the cathode 50 and reduce the problem of uneven brightness caused by the voltage drop (IR drop).

Please refer to FIG. 24, based on the foregoing method of manufacturing an OLED display device, the present disclosure further provides an OLED display device, comprising an OLED substrate 80. The OLED substrate 80 comprises a base substrate 10, a plurality of anodes 21 disposed on the base substrate 10 and arranged in array, an auxiliary cathode 22 disposed on the base substrate 10 in an interval region of the plurality of anodes 21, a pixel definition layer 30 disposed on the base substrate 10, the plurality of anodes 21 and the auxiliary cathode 22, a plurality of first openings 31 disposed on the pixel definition layer 30 corresponding to the plurality of anodes 21 respectively, a second opening 32 disposed on the pixel definition layer 30 corresponding to the auxiliary cathode 22, a plurality of OLED light emitting layers 40 respectively disposed on the plurality of anodes 21, and an entire surface distributed cathode 50 disposed on the plurality of OLED light emitting layers 40, the pixel definition layer 30 and the auxiliary cathode 22; wherein the plurality of OLED light emitting layers 40 are not connected.

Specifically, the OLED display device 200 further comprises: an encapsulating cover 90 disposed opposite to the OLED substrate 80, and an encapsulant 91 disposed between the OLED substrate 80 and the encapsulating cover 90 for sealing and connecting the OLED substrate 80 and the encapsulating cover 90.

Specifically, the encapsulating cover 90 is a glass substrate or a glass substrate with a color filter. The glass substrate is used with the OLED substrate 80 having an RGB side-by-side structure. The glass substrate having a color filter is used with the OLED substrate 80 having a white OLED structure.

Specifically, each of the plurality of anodes 21 is a reflective electrode. The OLED display device prepared by the present disclosure is a top-emitting OLED display device. Preferably, each of the plurality of anodes 21 is a composite layer formed by sandwiching a metal thin film with two transparent conductive oxide thin films. Preferably, the material of the transparent conductive oxide thin film comprises indium tin oxide (ITO), the material of the metal thin film comprises silver (Ag).

Specifically, the auxiliary cathode 22 is distributed in a grid pattern.

Specifically, the material of the auxiliary cathode 22 comprises one or more of metals such as silver (Ag), copper (Cu), aluminum (Al), and molybdenum (Mo).

Specifically, the auxiliary cathode 22 has a thickness of 0.5 μm~10 μm.

Specifically, the second opening 32 is distributed in a grid pattern.

Specifically, the base substrate 10 is a TFT substrate.

Specifically, the OLED substrate 80 further comprises: forming a planarization layer (not shown) between the base substrate 10 and the plurality of anodes 21.

Specifically, an area of the plurality of first openings 31 is smaller than the area of the plurality of anodes 21; an area of the second opening 32 is smaller than the area of the auxiliary cathode 22.

Specifically, the OLED light emitting layer 40 comprises a hole injection layer, a hole transport layer, a light-emitting layer, an electron transport layer, and an electron injection layer sequentially arranged from bottom to top on the anode 21. For an OLED substrate with a white OLED structure, the light emitting layer is a white light emitting layer. For an OLED substrate with a RGB side-by-side structure, the light emitting layer is a red/green/blue light emitting layer.

Specifically, the cathode 50 is a transparent electrode or a translucent electrode.

If the cathode 50 is a transparent electrode, the material of the cathode 50 is transparent oxide (TCO), and the transparent oxide is preferably indium zinc oxide (IZO). The thickness of the cathode 50 is between 100 nm~500 nm.

If the cathode 50 is a translucent electrode, the material of the cathode 50 is metal, and the metal is preferably silver (Ag) or magnesium-silver alloy (MgAg), and the thickness of the cathode 50 is between 10 nm~20 nm. The translucent electrode has a light transmittance of 40% or more.

The foregoing OLED display device comprises a plurality of OLED light emitting layers 40 respectively disposed on the plurality of anodes 21, wherein a plurality of the OLED light emitting layers 40 are not connected to each other so that lateral current leakage of the common layer does not occur, a cross color phenomenon due to carrier migration between adjacent sub-pixels is avoided, with can ensure a better display effect. And the auxiliary cathode 22 is connected under the cathode 50 to reduce the sheet resistance of the cathode 50 and reduce the problem of uneven brightness caused by the voltage drop (IR drop).

It is worth mentioning that in the present disclosure, "the interval region corresponding to the plurality of first openings 31", the "interval region corresponding to the plurality of first openings 31", and "the interval region corresponding to the second openings 32" all express the same meaning, which means "corresponding to an interval region of a plurality of sub-pixels"

In the manufacturing method of the OLED display device of the present disclosure, the inverted trapezoidal photoresist 60 may also be disposed in a linear manner in the interval region of a plurality of sub-pixels. In this case, the OLED light emitting thin film 41 is only blocked in one direction (which is an extending direction perpendicular to the inverted trapezoidal photoresist 60), the OLED light emitting thin film 41 in other direction not being blocked (the extending direction of the inverted trapezoidal photoresist 60) is able to increase the interval region of the adjacent sub-pixels, so as to increase the resistance of the OLED light emitting thin film 41 in the interval region between the adjacent sub-pixels to prevent the carrier from flowing between the adjacent sub-pixels and prevent the occurrence of the cross color phenomenon.

In addition, when the auxiliary cathode is disposed under the cathode, the auxiliary cathode may be provided on the TFT substrate and be provided on the same layer as the source/drain or the gate, so that the sheet resistance of the cathode 50 can be significantly reduced and the uneven brightness problem caused by voltage drop (IR drop) can be reduced, therefore improving the display effect.

In summary, the present disclosure provides an OLED display device and a manufacturing method thereof. The manufacturing method of the OLED display device of the present disclosure realizes the effect of a plurality of non-connected OLED light emitting layers by providing an inverse trapezoidal photoresist in the interval region of a plurality of sub-pixels. The produced OLED display does not have the lateral current leakage of the common layer, that avoiding cross color phenomenon caused by carrier migration between adjacent sub-pixels, and ensuring a better display effect of the OLED display device. And, by fabricating an auxiliary cathode connected to the cathode above or below the cathode, the sheet resistance of the cathode can be reduced, and reduce uneven brightness caused by voltage drop. The OLED display device of the present disclosure is manufactured by the above method without lateral current leakage of the common layer, avoids the cross color phenomenon due to the carrier migration between adjacent sub-pixels, and the OLED display device has a better display effect. The cathode has a lower sheet resistance, which can reduce the brightness unevenness caused by the voltage drop.

Finally, it should be noted that the above embodiments are merely illustrative of the technical solutions of the present disclosure and are not intended to be limiting thereof. For the person skilled in the art of the disclosure, without departing from the concept of the disclosure, simple deductions or substitutions can be made and should be included in the protection scope of the disclosure.

What is claimed is:

1. A method for manufacturing an OLED display device comprising: a step of manufacturing an OLED substrate and a step of encapsulating the OLED substrate, wherein the step of manufacturing the OLED substrate comprises: providing a base substrate, forming a plurality of anodes on the base substrate arranged in array, forming a pixel definition layer on the base substrate and the plurality of anodes, forming a plurality of first openings corresponding to the plurality of anodes respectively on the pixel definition layer, forming a plurality of OLED light emitting layers respectively on the plurality of anodes, forming a cathode on the plurality of OLED light emitting layers and the pixel definition layer, and fabricating an auxiliary cathode connected with the cathode above or below the cathode; wherein the plurality of OLED light emitting layers are not connected; and the auxiliary cathode is arranged corresponding to an interval region of the plurality of anodes;

wherein the method specifically comprises the following steps:

step S1, providing the base substrate, forming the plurality of anodes on the base substrate arranged in array, forming the pixel definition layer on the base substrate and the plurality of anodes, forming the plurality of first openings corresponding to the plurality of anodes respectively on the pixel definition layer;

step S2: forming an inverted trapezoidal photoresist on the pixel defining layer corresponding to an interval region of the plurality of first openings;

step S3, preparing an OLED light emitting thin film on the inverted trapezoidal photoresist, the pixel defining layer and the plurality of anodes;

step S4, peeling off the inverted trapezoidal photoresist to remove the OLED light emitting thin film above the inverted trapezoidal photoresist, and obtaining a plurality of non-connected OLED light emitting layers;

step S5: forming an entire surface distributed cathode over the plurality of OLED light emitting layers and the pixel definition layer;

step S6, fabricating the auxiliary cathode on the cathode corresponding to the interval region of the plurality of first openings to obtain an OLED substrate;

step S7, encapsulating the OLED substrate to obtain the OLED display device, or, the method specifically comprises the following steps:

step S1, providing the base substrate, forming the plurality of anodes on the base substrate arranged in array, forming the pixel definition layer on the base substrate and the plurality of anodes, forming the plurality of first openings corresponding to the plurality of anodes respectively on the pixel definition layer, and forming a second opening in an interval region of the plurality of first openings;

step S2: forming an inverted trapezoidal photoresist on the base substrate at a bottom of the second opening;

step S3, preparing an OLED light emitting thin film on the inverted trapezoidal photoresist, the pixel defining layer and the plurality of anodes;

step S4, peeling off the inverted trapezoidal photoresist to remove the OLED light emitting thin film above the inverted trapezoidal photoresist, and obtaining a plurality of non-connected OLED light emitting layers;

step S5: forming an entire surface distributed cathode over the plurality of OLED light emitting layers and the base substrate;

step S6, fabricating the auxiliary cathode on the cathode corresponding to the second opening to obtain an OLED substrate;

step S7, encapsulating the OLED substrate to obtain the OLED display device;

or, the method specifically comprises the following steps:

step S1, providing the base substrate, forming the plurality of anodes on the base substrate arranged in array, and the auxiliary cathode arranged in the interval region of the plurality of anodes; forming the pixel definition layer on the base substrate, the plurality of anodes, and the auxiliary cathode; forming the plurality of first openings corresponding to the plurality of anodes respectively on the pixel definition layer; and forming a second opening corresponding to the auxiliary cathode;

step S2: forming an inverted trapezoidal photoresist on the auxiliary cathode at a bottom of the second opening;

step S3, preparing an OLED light emitting thin film on the inverted trapezoidal photoresist, the pixel defining layer and the plurality of anodes;

step S4, peeling off the inverted trapezoidal photoresist to remove the OLED light emitting thin film above the inverted trapezoidal photoresist, and obtaining a plurality of non-connected OLED light emitting layers;

step S5: forming an entire surface distributed cathode over the plurality of OLED light emitting layers, the pixel definition layer and the auxiliary cathode to obtain an OLED substrate;

step S6, encapsulating the OLED substrate to obtain the OLED display device.

2. An OLED display device comprising an OLED substrate, the OLED substrate comprising a base substrate, a plurality of anodes disposed on the base substrate and arranged in array, a pixel definition layer disposed on the base substrate and the plurality of anodes, a plurality of first openings disposed penetrating through the pixel definition layer and corresponding to the plurality of anodes respectively, a plurality of OLED light emitting layers respectively disposed on the plurality of anodes, a cathode disposed on the plurality of OLED light emitting layers and the pixel definition layer, and an auxiliary cathode connected with the cathode;

wherein the plurality of OLED light emitting layers are not connected;

wherein the auxiliary cathode comprises a plurality of portions spaced from one another and respectively corresponding to interval regions of the plurality of anodes;

wherein a plurality of second openings are formed penetrating through the pixel definition layer in interval regions of the plurality of first openings;

wherein the plurality of portions of the auxiliary cathode are disposed in the plurality of second openings respectively and connected with the cathode.

3. The OLED display device according to claim 2, wherein the plurality of portions of the auxiliary cathode are arranged above the cathode, and the base substrate and each of the plurality of portions of the auxiliary cathode have the cathode sandwiched therebetween.

4. The OLED display device according to claim 2, wherein the plurality of portions of the auxiliary cathode are arranged below the cathode and in contact with the base substrate, the pixel definition layer is disposed on the plurality of portions of the auxiliary cathode, and each of the plurality of portions of the auxiliary cathode is sandwiched between the base substrate and the cathode.

5. The OLED display device according to claim 2, wherein the auxiliary cathode is distributed in a grid pattern.

6. A method for manufacturing an OLED display device, comprising a step of manufacturing an OLED substrate and a step of encapsulating the OLED substrate, wherein the step of manufacturing the OLED substrate comprises: providing a base substrate, forming a plurality of anodes on the base substrate arranged in array, forming a pixel definition layer on the base substrate and the plurality of anodes, forming a plurality of first openings corresponding to the plurality of anodes respectively on the pixel definition layer, forming a plurality of OLED light emitting layers on the plurality of anodes respectively, forming a cathode on the plurality of OLED light emitting layers and the pixel definition layer, and fabricating an auxiliary cathode connected with the cathode above or below the cathode; wherein the plurality of OLED light emitting layers are not connected, and the auxiliary cathode is arranged corresponding to an interval region of the plurality of anodes;

wherein the method specifically comprises the following steps:

step S1, providing the base substrate, forming the plurality of anodes on the base substrate arranged in array, forming the pixel definition layer on the base substrate and the plurality of anodes, forming the plurality of first openings corresponding to the plurality of anodes respectively on the pixel definition layer;

step S2: forming an inverted trapezoidal photoresist on the pixel defining layer corresponding to an interval region of the plurality of first openings;

step S3, preparing an OLED light emitting thin film on the inverted trapezoidal photoresist, the pixel defining layer and the plurality of anodes;

step S4, peeling off the inverted trapezoidal photoresist to remove the OLED light emitting thin film above the inverted trapezoidal photoresist, and obtaining a plurality of non-connected OLED light emitting layers;

step S5: forming an entire surface distributed cathode over the plurality of OLED light emitting layers and the pixel definition layer;

step S6, fabricating the auxiliary cathode on the cathode corresponding to the interval region of the plurality of first openings to obtain an OLED substrate;

step S7, encapsulating the OLED substrate to obtain the OLED display device;

wherein the inverted trapezoidal photoresist is distributed in a grid pattern; and the auxiliary cathode is distributed in a grid pattern.

\* \* \* \* \*